(12) United States Patent
Wu et al.

(10) Patent No.: US 10,087,071 B2
(45) Date of Patent: Oct. 2, 2018

(54) SEMICONDUCTOR STRUCTURE AND MANUFACTURING METHOD THEREOF

(71) Applicant: TAIWAN SEMICONDUCTOR MANUFACTURING COMPANY LTD, Hsinchu (TW)

(72) Inventors: Tzu-Heng Wu, New Taipei (TW); Chia-Hua Chu, Hsinchu County (TW); Yi-Heng Tsai, Hsinchu (TW); Cheng San Chou, Hsinchu (TW); Chen Hsiung Yang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 29 days.

(21) Appl. No.: 15/333,520

(22) Filed: Oct. 25, 2016

(65) Prior Publication Data

US 2018/0111824 A1    Apr. 26, 2018

(51) Int. Cl.
*B81B 7/00* (2006.01)
*B81C 1/00* (2006.01)

(52) U.S. Cl.
CPC .......... *B81B 7/008* (2013.01); *B81C 1/00246* (2013.01); *B81B 2207/096* (2013.01); *B81B 2207/115* (2013.01); *B81C 2201/053* (2013.01); *B81C 2203/0728* (2013.01)

(58) Field of Classification Search
None
See application file for complete search history.

(56) References Cited

U.S. PATENT DOCUMENTS

| | | | |
|---|---|---|---|
| 8,987,059 B2 | 3/2015 | Liang et al. |
| 9,040,334 B2 | 5/2015 | Chu et al. |
| 9,065,358 B2 | 6/2015 | Tsai et al. |
| 9,085,455 B2 | 7/2015 | Cheng et al. |
| 9,085,456 B2 | 7/2015 | Tsai et al. |
| 9,122,827 B2 | 9/2015 | Chen et al. |
| 9,133,017 B2 | 9/2015 | Liang et al. |
| 9,138,994 B2 | 9/2015 | Peng et al. |
| 9,139,420 B2 | 9/2015 | Chang et al. |
| 9,139,423 B2 | 9/2015 | Chien et al. |
| 9,181,083 B2 | 11/2015 | Tsai et al. |
| 9,187,317 B2 | 11/2015 | Cheng et al. |
| 9,233,839 B2 | 1/2016 | Liu et al. |
| 9,236,877 B2 | 1/2016 | Peng et al. |
| 9,238,581 B2 | 1/2016 | Wu et al. |

(Continued)

*Primary Examiner* — Whitney T Moore
(74) *Attorney, Agent, or Firm* — WPAT, P.C.; Anthony King

(57) ABSTRACT

A semiconductor structure includes a first substrate, a second substrate disposed over the first substrate, and including a first surface, a second surface opposite to the first surface, a via portion extending between the first surface and the second surface, a first through hole and a second through hole, and a device disposed over the second surface, and including a dielectric layer, a backplate at least partially exposed from the dielectric layer and a membrane at least partially exposed from the dielectric layer and disposed between the backplate and the first substrate, wherein the via portion is disposed within the second through hole, and the dielectric layer is bonded with the second substrate, and the device is electrically connected to the first substrate through the via portion.

19 Claims, 16 Drawing Sheets

(56) References Cited

U.S. PATENT DOCUMENTS

| | | |
|---|---|---|
| 2014/0287548 A1 | 9/2014 | Lin et al. |
| 2015/0137303 A1 | 5/2015 | Chou et al. |
| 2015/0175405 A1 | 6/2015 | Cheng |
| 2015/0175407 A1 | 6/2015 | Cheng et al. |
| 2015/0196912 A1 | 7/2015 | Tsai et al. |
| 2016/0119722 A1* | 4/2016 | Chu .................... H04R 19/005 257/416 |
| 2016/0229692 A1* | 8/2016 | Lin .................... B81C 1/00238 |

* cited by examiner

SEMICONDUCTOR STRUCTURE AND MANUFACTURING METHOD THEREOF

BACKGROUND

Electronic equipment involving semiconductive devices are essential for many modern applications. The semiconductive device has experienced rapid growth. Technological advances in materials and design have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices.

Micro-electro mechanical system (MEMS) devices have been recently developed and are also commonly involved in electronic equipment. The MEMS device is micro-sized device, usually in a range from less than 1 micron to several millimeters in size. The MEMS device includes fabrication using semiconductive materials to form mechanical and electrical features. The MEMS device may include a number of elements (e.g., stationary or movable elements) for achieving electro-mechanical functionality. MEMS devices are widely used in various applications. MEMS applications include motion sensors, pressure sensors, printer nozzles, or the like. Other MEMS applications include inertial sensors, such as accelerometers for measuring linear acceleration and gyroscopes for measuring angular velocity. Moreover, MEMS applications are extended to optical applications, such as movable mirrors, and radio frequency (RF) applications, such as RF switches or the like.

As technologies evolve, design of the devices becomes more complicated in view of small dimension as a whole and increase of functionality and amounts of circuitries. The devices involve many complicated steps and increases complexity of manufacturing. The increase in complexity of manufacturing may cause deficiencies such as high yield loss, warpage, low signal to noise ratio (SNR), high parasitic capacitance, etc. Therefore, there is a continuous need to modify structure and manufacturing method of the devices in the electronic equipment in order to improve the device performance as well as reduce manufacturing cost and processing time.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
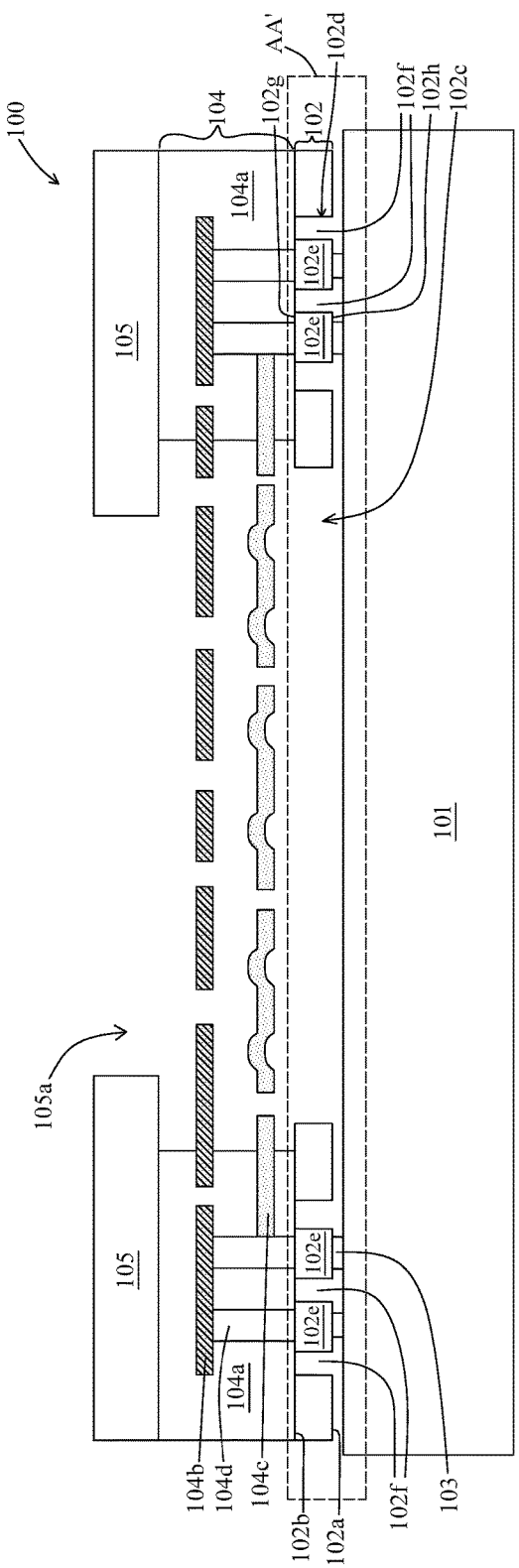
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Microphone is an electronic equipment. The microphone is an acoustic sensor that converts variation of air pressure such as acoustic pressure or sound wave into electrical signals. The microphone can involve a MEMS device. The MEMS device includes a stationary plate allowing the acoustic pressure passing through and a movable membrane disposed above the plate and responding to the acoustic pressure. The movement or oscillation of the membrane creates a change in an amount of capacitance between the membrane and the plate. The amount of change would then be translated into an electrical signal accordingly. The MEMS device is disposed adjacent to and integrated with a complementary metal oxide semiconductor (CMOS) device by wire bonding. However, such integration would induce parasitic capacitance, and thus result in high noise, low SNR and poor performance of the microphone.

In the present disclosure, a semiconductor structure is disclosed. The semiconductor structure includes a first substrate, a second substrate over the first substrate and a device over the second substrate. The second substrate is conductive, has ultra-low resistance or has a resistivity less than 0.01 ohm-cm. Further, the second substrate includes a through hole and a via portion disposed within the through hole. The via portion is part of the second substrate and thus is conductive. In some embodiments, the semiconductor structure is manufactured by wafer level chip scale packaging (WLCSP) operations. In some embodiments, the first substrate is CMOS substrate and the second substrate is MEMS substrate, and the MEMS substrate is bonded with the CMOS substrate by eutectic bonding operations, such that a cavity or back chamber between the CMOS substrate and the MEMS substrate is formed. Such bonding of the CMOS substrate and MEMS substrate can lower parasitic capacitance and decrease overall package size. Further, the device can electrically connect to the first substrate through the via portion. The device integrated with the first substrate by the via portion of the second substrate can reduce or prevent parasitic capacitance, increase sensitivity, minimize a size of the semiconductor structure and lower manufacturing cost.

FIG. 1 is a schematic cross sectional view of a semiconductor structure 100 in accordance with some embodiments of the present disclosure. The semiconductor structure 100 includes a first substrate 101, a second substrate 102 and a device 104. In some embodiments, the semiconductor structure 100 is configured to sense an acoustic pressure such as sound wave. In some embodiments, the semiconductor structure 100 is a part of a microphone. The acoustic pressure is received by the semiconductor structure 100 and then is converted into an electrical signal.

In some embodiments, the first substrate 101 is fabricated with a predetermined functional circuit thereon. In some embodiments, the first substrate 101 includes several electrical components or circuitries disposed over the first substrate 101. In some embodiments, the first substrate 101 is an interposer or a wafer. In some embodiments, the first substrate 101 includes semiconductive material such as silicon, germanium, gallium, arsenic or etc. In some embodiments, the first substrate 101 is in a quadrilateral, rectangular, square, polygonal or any other suitable shapes. In some embodiments, the first substrate 101 is a CMOS substrate which includes CMOS components electrically connected to the circuitries in the CMOS substrate.

Figure 2:
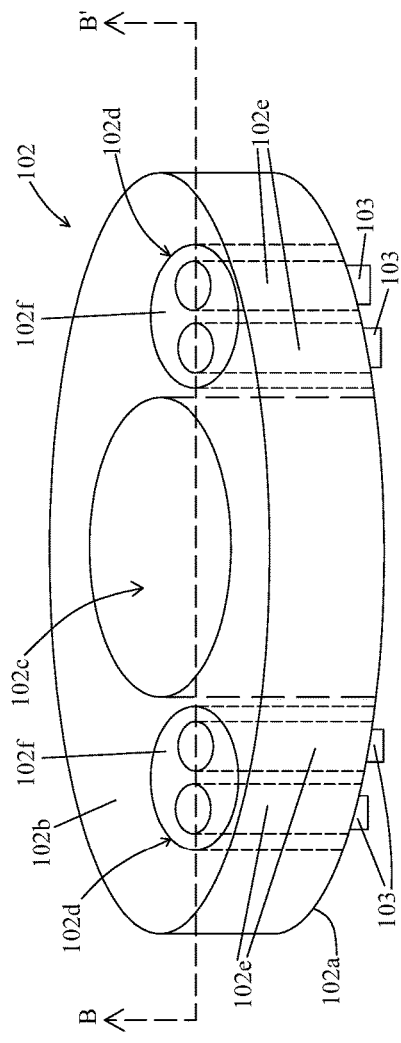
FIG. 2 is a schematic perspective view of a part AA' in FIG. 1.

FIG. 2 is a schematic perspective view of a part AA' of the semiconductor structure 100 of FIG. 1. FIG. 2 illustrates a perspective view of the second substrate 102. The cross sectional view of the second substrate 102 as shown in FIG. 1 is along BB' indicated in FIG. 2. In some embodiments, the second substrate 102 is disposed over the first substrate 101. In some embodiments, the second substrate 102 is spaced from the first substrate 101 in a distance. In some embodiments, the second substrate 102 is an interposer or a wafer. In some embodiments, the second substrate 102 is conductive or has ultra-low resistance. In some embodiments, the second substrate 102 has a resistivity substantially less than 0.01 ohm-cm. In some embodiments, the second substrate 102 includes silicon. In some embodiments, the second substrate 102 is in a quadrilateral, rectangular, square, polygonal or any other suitable shapes. In some embodiments, a thickness of the second substrate 102 is about 300 um to about 750 um. In some embodiments, the thickness of the second substrate 102 is about 325 um to about 725 um.

In some embodiments, the second substrate 102 includes a first surface 102a and a second surface 102b opposite to the first surface 102a. In some embodiments, the first surface 102a faces to the first substrate 101. In some embodiments, the second surface 102b is further away from the first substrate 101.

In some embodiments, the second substrate 102 includes a first through hole 102c, a second through hole 102d and a via portion 102e extending between the first surface 102a and the second surface 102b. In some embodiments, the first through hole 102c is extended through the second substrate 102. In some embodiments, the first through hole 102c is disposed at a central portion of the second substrate 102. In some embodiments, the first through hole 102c is surrounded by the second through hole 102d and the via portion 102e. In some embodiments, a cross section of the first through hole 102c is in a circular, quadrilateral, triangular, polygonal or any other suitable shapes.

In some embodiments, the second through hole 102d is extended through the second substrate 102. In some embodiments, the second through hole 102d surrounds the via portion 102e. In some embodiments, a width of the first through hole 102c is substantially greater than a width of the second through hole 102d. In some embodiments, a cross section of the second through hole 102d is in a circular, quadrilateral, triangular, polygonal or any other suitable shapes.

In some embodiments, the via portion 102e is disposed and extended within the second through hole 102d. In some embodiments, the via portion 102e is part of the second substrate 102. In some embodiments, the via portion 102e is conductive or has ultra-low resistance. In some embodiments, the via portion 102e has a resistivity substantially less than 0.01 ohm-cm. In some embodiments, the via portion 102e includes silicon. In some embodiments, the via portion 102e is a silicon via. In some embodiments, a gap 102f is disposed between the via portion 102e and the second through hole 102d. In some embodiments, the via portion 102e is surrounded by the gap 102f. In some embodiments, the via portion 102e is electrically isolated from rest portions of the second substrate 102 by the gap 102f.

In some embodiments, a cross section of the via portion 102e is a circular, quadrilateral, triangular, polygonal or any other suitable shapes. In some embodiments, a height of the via portion 102e is about 300 um to about 750 um. In some embodiments, the height of the via portion 102e is about 325 um to about 725 um. In some embodiments, the height of the via portion 102e is substantially same as the thickness of the second substrate 102. In some embodiments, a width of the via portion 102e is substantially smaller than the width of the second through hole 102d.

Referring back to FIG. 1, in some embodiments, the second substrate 102 is bonded with the first substrate 101 by a pad 103. In some embodiments, the pad 103 is disposed between the second substrate 102 and the first substrate 101. In some embodiments, the pad 103 is bonded with the via portion 102e and the first substrate 101. In some embodiments, the via portion 102e includes a first end 102g and a second end 102h. In some embodiments, the second end 102h faces to the first substrate 101. In some embodiments, the second end 102h is electrically connected to the first substrate 101. In some embodiments, the pad 103 is disposed over or attached to the second end 102h, such that the via portion 102e is electrically connected to the first substrate 101 by the pad 103. In some embodiments, the pad 103 is conductive or semiconductive. In some embodiments, the pad 103 includes copper, silver, gold, germanium or etc. In some embodiments, the pad 103 is a contact or an electrode.

In some embodiments, the device 104 is disposed over the second substrate 102. In some embodiments, the device 104 is disposed over and bonded with the second surface 102b of the second substrate 102. In some embodiments, the device 104 is electrically connected to the first substrate 101 through the via portion 102e. In some embodiments, the device 104 is a MEMS device including electro-mechanical elements. In some embodiments, the device 104 is a MEMS microphone device. In some embodiments, the device 104 includes piezoelectric material. In some embodiments, the device 104 is a piezoelectric microphone device. In some embodiments, the device 104 includes a dielectric layer 104a, a backplate 104b and a membrane 104c. In some embodiments, the dielectric layer 104a is disposed over and bonded with the second surface 102b of the second substrate 102 and the via portion 102e. In some embodiments, the dielectric layer 104a is bonded with the first end 102g of the via portion 102e. In some embodiments, the dielectric layer 104a includes dielectric material such as oxide, silicon oxide, etc. In some embodiments, the dielectric layer 104a encapsulates a portion of the backplate 104b and a portion of the membrane 104c.

In some embodiments, the backplate 104b is a stationary element and is not movable by an acoustic pressure received by the semiconductor structure 100. In some embodiments, the backplate 104b is a stiff perforated element which allows an acoustic pressure passing through. In some embodiments, the backplate 104b is doped with suitable dopants to include several doped regions. In some embodiments, the backplate 104b includes several apertures configured for an acoustic pressure received by the semiconductor structure 100 passing through. In some embodiments, the backplate 104b is in circular, rectangular, quadrilateral, triangular, hexagon, or any other suitable shapes.

In some embodiments, the backplate 104b is electrically connected to the via portion 102e. In some embodiments, the backplate 104b is electrically connected to the first substrate 101 through the via portion 102e and the pad 103. In some embodiments, a portion of the backplate 104b within the dielectric layer 104a is electrically connected to a conductive structure 104d, and the conductive structure 104d is contacted with or bonded with the via portion 102e. In some embodiments, the conductive structure 104d is bonded with the first end 102g of the via portion 102e. In some embodiments, the conductive structure 104d is a conductive line, via, pillar, wire or the like. In some embodiments, the backplate 104b is at least partially exposed from the dielectric layer 104a. In some embodiments, a portion of the backplate 104b exposed from the dielectric layer 104a is disposed over or aligned with the first through hole 102c.

In some embodiments, the backplate 104b is disposed over the membrane 104c. In some embodiments, the membrane 104c is a movable or oscillateable element. The membrane 104c is displaceable relative to the backplate 104b and is served as a diaphragm. In some embodiments, the membrane 104c is conductive and capacitive. In some embodiments, the membrane 104c is configured to sense an acoustic pressure received by the semiconductor structure 100. In some embodiments, a magnitude and/or a frequency of the displacement of the membrane 104c corresponds to a volume and/or pitch of an acoustic pressure impinged on the membrane 104c. In some embodiments, the displacement of the membrane 104c relative to the backplate 104b would cause a capacitance change between the membrane 104c and the backplate 104b. The capacitance change would then be translated into an electrical signal. In some embodiments, the membrane 104c includes several corrugations configured to relieve undesired stress over the membrane 104c. In some embodiments, the membrane 104c includes several apertures configured to relieve undesired stress over the membrane 104c. In some embodiments, the membrane 102 is in circular, rectangular, quadrilateral, triangular, hexagon, or any other suitable shapes.

In some embodiments, the membrane 104c is disposed between the backplate 104b and the first substrate 101. In some embodiments, the membrane 104c is electrically connected to the via portion 102e. In some embodiments, the membrane 104c is electrically connected to first substrate 101 through the via portion 102e and the pad 103. In some embodiments, a portion of the membrane 104c within the dielectric layer 104a is electrically connected to the conductive structure 104d, and the conductive structure 104d is contacted with or bonded with the via portion 102e. In some embodiments, the membrane 104c is at least partially exposed from the dielectric layer 104a. In some embodiments, a portion of the membrane 104c exposed from the dielectric layer 104a is disposed over or aligned with the first through hole 102c.

In some embodiments, a third substrate 105 is disposed over the device 104. In some embodiments, the third substrate 105 is a capping wafer. In some embodiments, the third substrate 105 includes silicon, glass, etc. In some embodiments, the third substrate 105 is a silicon substrate or a glass substrate. In some embodiments, the third substrate 105 includes a third through hole 105a disposed over or aligned with the first through hole 102c. In some embodiments, the third through hole 105a is disposed over the backplate 104b exposed from the dielectric layer 104a and the membrane 104c exposed from the dielectric layer 104a. In some embodiments, the third through hole 102c is configured to receive an acoustic pressure. In some embodiments, a width of the third through hole 105a is substantially smaller than the width of the first through hole 102c.

Figure 3:
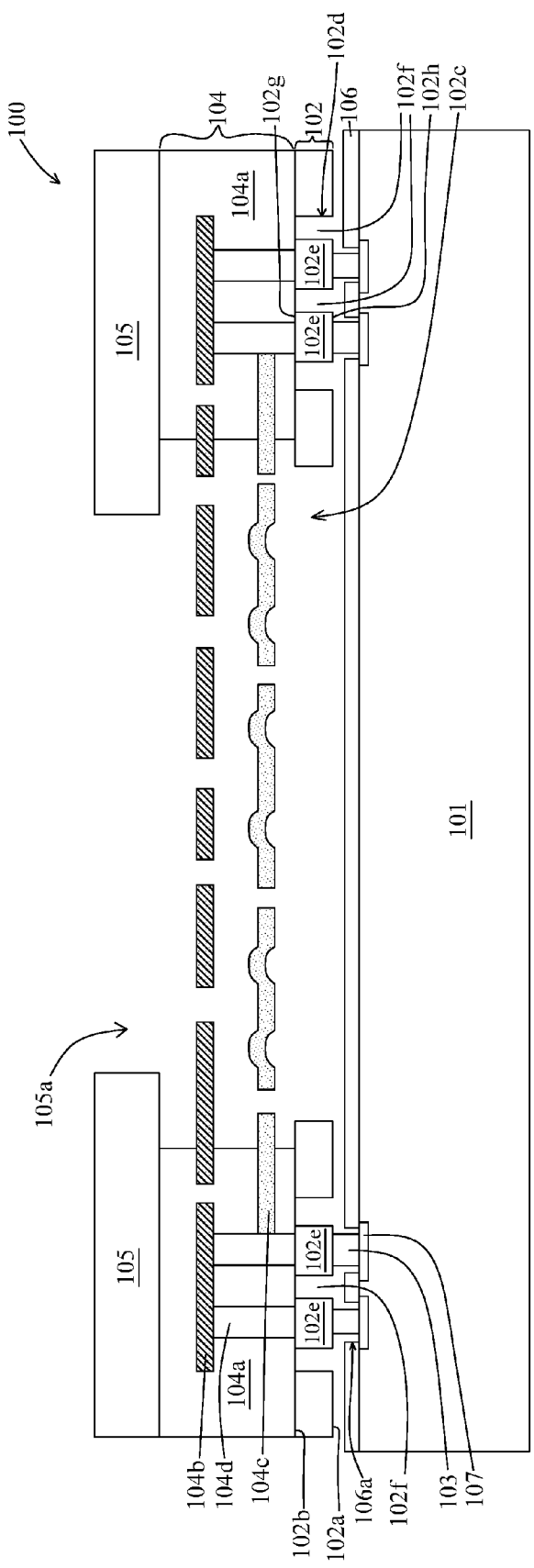
FIG. 3 is a schematic cross sectional view of a semiconductor structure in accordance with some embodiments of the present disclosure.

In some embodiments as shown in FIG. 3, the semiconductor structure 100 includes the first substrate 101, the second substrate 102, the device 104 and the third substrate 105, which have similar configurations as described above or illustrated in FIG. 1 or 2. In some embodiments, the first substrate 101 includes a patterned protective layer 106 and a bond pad 107 disposed over the first substrate 101.

In some embodiments, the patterned protective layer 106 is configured to protect the first substrate 101 or other components disposed over or within the first substrate 101 from being etched away. In some embodiments, the patterned protective layer 106 is configured to protect the first substrate 101 from being attacked by hydrofluoric (HF) acid vapor. In some embodiments, the patterned protective layer 106 includes aluminum oxide ($Al_2O_3$). In some embodiments, the patterned protective layer 106 includes an opening 106a for electrically connecting the via portion 102e with the first substrate 101. In some embodiments, the bond pad 107 is at least partially exposed from the patterned protective layer 106. In some embodiments, the bond pad 107 is exposed from the opening 106a. In some embodiments, the bond pad 107 is disposed over the first substrate 101. In some embodiments, the bond pad 107 is configured to receive an external interconnect structure. In some embodiments, the bond pad 107 includes aluminum, copper, tin or gold.

Figure 4:
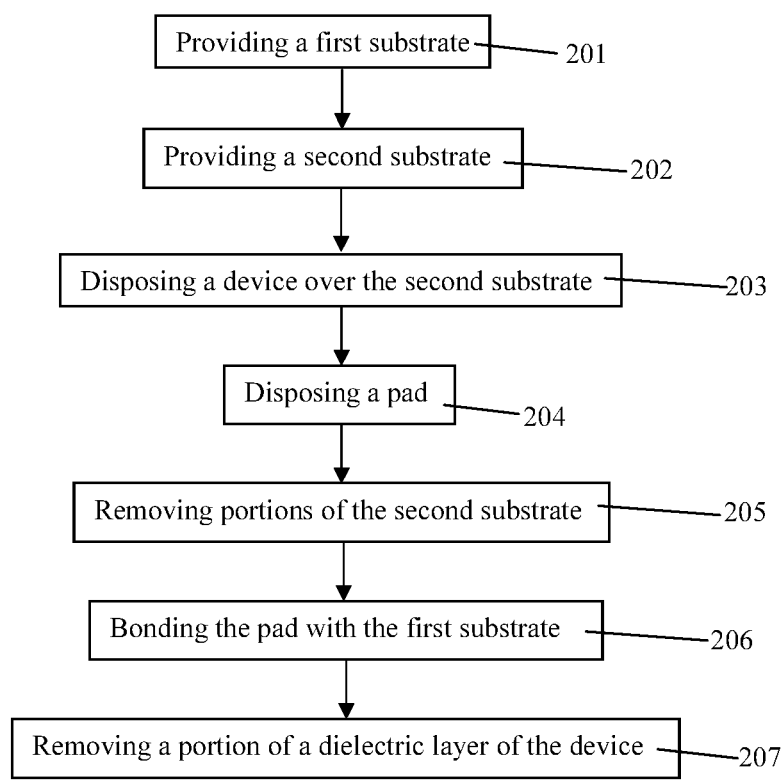
FIG. 4 is a flow diagram of a method of manufacturing a semiconductor structure in accordance with some embodiments of the present disclosure.

In the present disclosure, a method of manufacturing a semiconductor structure 100 is also disclosed. In some embodiments, a semiconductor structure 100 is formed by a method 200. The method 200 includes a number of operations and the description and illustration are not deemed as a limitation as the sequence of the operations. FIG. 4 is an embodiment of a method 200 of manufacturing a semiconductor structure. The method 200 includes a number of operations (201, 202, 203, 204, 205, 206 and 207).

Figure 4A:
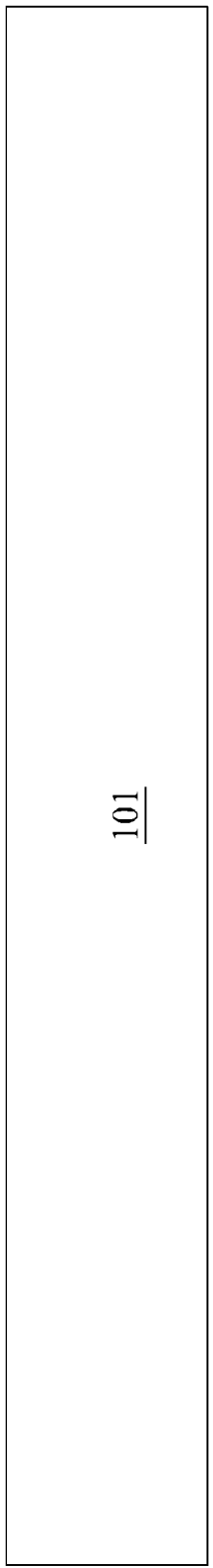
FIGS. 4A-4N are schematic views of manufacturing a semiconductor structure by a method of FIG. 4 in accordance with some embodiments of the present disclosure.

In operation 201, a first substrate 101 is provided or received as shown in FIG. 4A. In some embodiments, the first substrate 101 is fabricated with a predetermined functional circuit thereon. In some embodiments, the first substrate 101 includes several electrical components or circuitries disposed over the first substrate 101. In some embodiments, the first substrate 101 is an interposer or a wafer. In some embodiments, the first substrate 101 includes semiconductive material such as silicon, germanium, gallium, arsenic or etc. In some embodiments, the first substrate 101 is a CMOS substrate which includes CMOS components electrically connected to the circuitries in the CMOS substrate. In some embodiments, the first substrate 101 has similar configuration as described above or illustrated in any one of FIGS. 1-3.

Figure 4B:
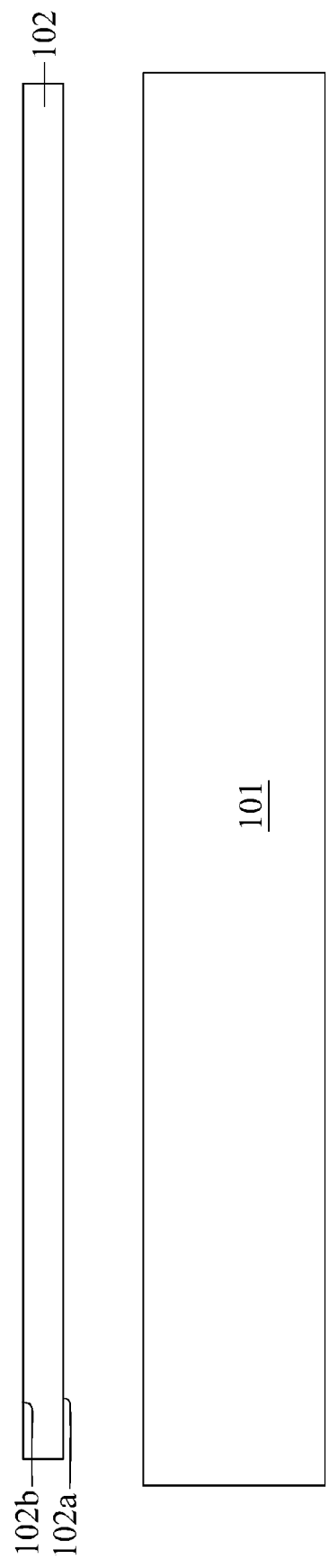

In operation 202, a second substrate 102 is provided or received as shown in FIG. 4B. In some embodiments, the second substrate 102 is an interposer or a wafer. In some embodiments, the second substrate 102 is conductive or has ultra-low resistance. In some embodiments, the second substrate 102 has a resistivity substantially less than 0.01 ohm-cm. In some embodiments, the second substrate 102 includes silicon. In some embodiments, a thickness of the second substrate 102 is about 300 um to about 750 um. In some embodiments, the second substrate 102 includes a first surface 102a and a second surface 102b opposite to the first surface 102a.

Figure 4C:
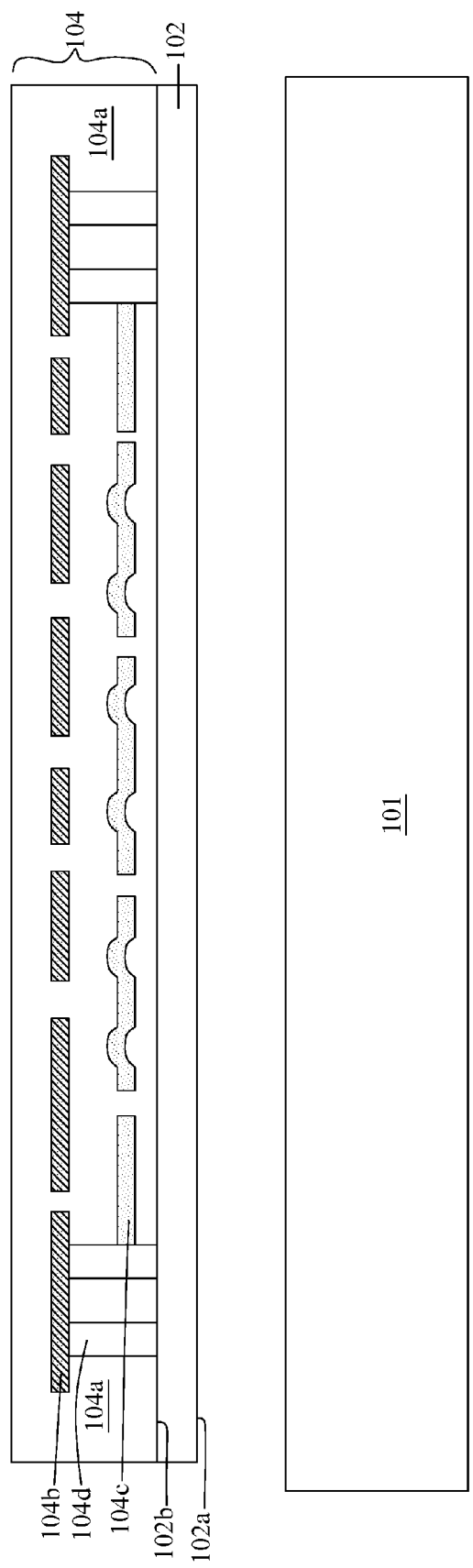

In operation 203, a device 104 is disposed over the second substrate 102 as shown in FIG. 4C. In some embodiments, the device 104 is disposed over or bonded with the second surface 102b of the second substrate 102. In some embodiments, the device 104 is a MEMS device including electromechanical elements. In some embodiments, the device 104 is a MEMS microphone device or a piezoelectric microphone device. In some embodiments, the device 104 are formed by microphone fabrication before disposing over the second substrate 102. In some embodiments, the device 104 includes a dielectric layer 104a, a backplate 104b and a membrane 104c. In some embodiments, the backplate 104b and the membrane 104c are formed within the dielectric layer 104a.

In some embodiments, the backplate 104b is disposed over the membrane 104c. In some embodiments, the dielectric layer 104a is disposed over the second substrate 102. In some embodiments, the dielectric layer 104a is bonded with the second surface 102b of the second substrate 102. In some embodiments, the dielectric layer 104a includes dielectric material such as oxide or etc. In some embodiments, the dielectric layer 104a is formed by any suitable deposition techniques such as chemical vapor deposition (CVD) or the like. In some embodiments, the backplate 104b and the membrane 104c are formed by patterning operations such as photolithography, etching, etc. In some embodiments, a conductive structure 104d is formed within the dielectric layer 104a. In some embodiments, the conductive structure 104d is electrically connected to the backplate 104b or the membrane 104c. In some embodiments, a portion of the conductive structure 104d is exposed from the dielectric layer 104a and is configured to connect to another conductive structure. In some embodiments, the device 104, the dielectric layer 104a, the backplate 104b, the membrane 104c and the conductive structure 104d have similar configurations as described above or illustrated in any one of FIGS. 1-3.

Figure 4D:
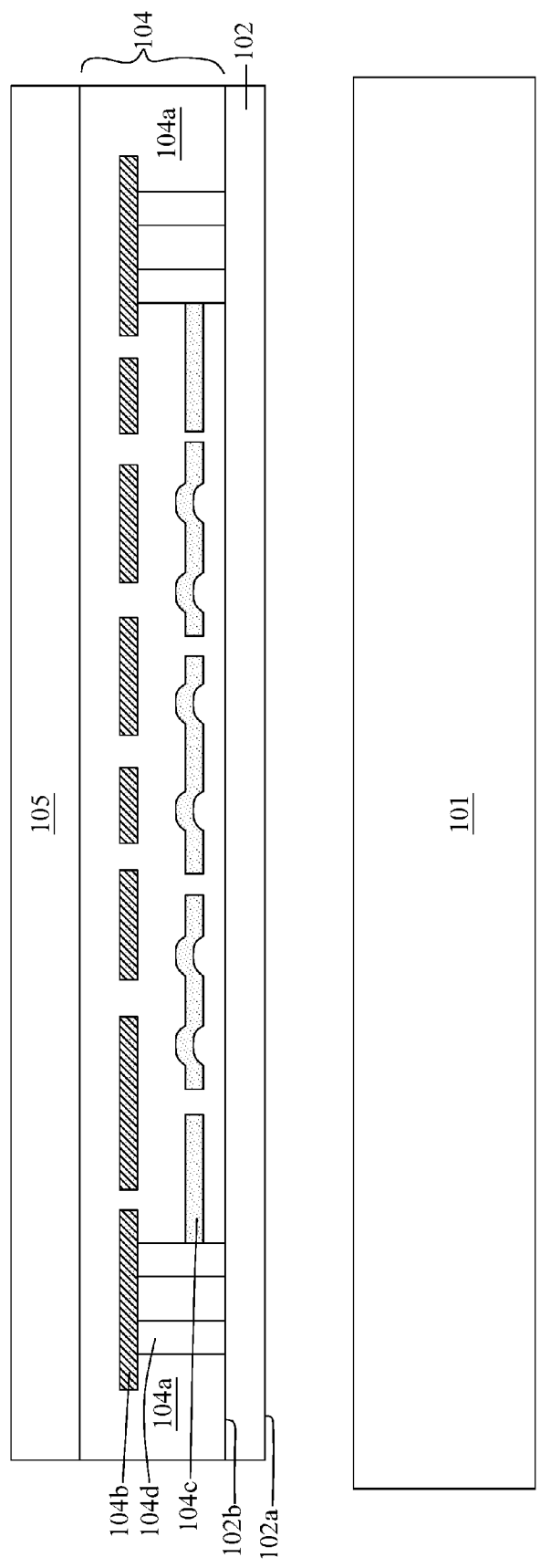
Figure 4E:
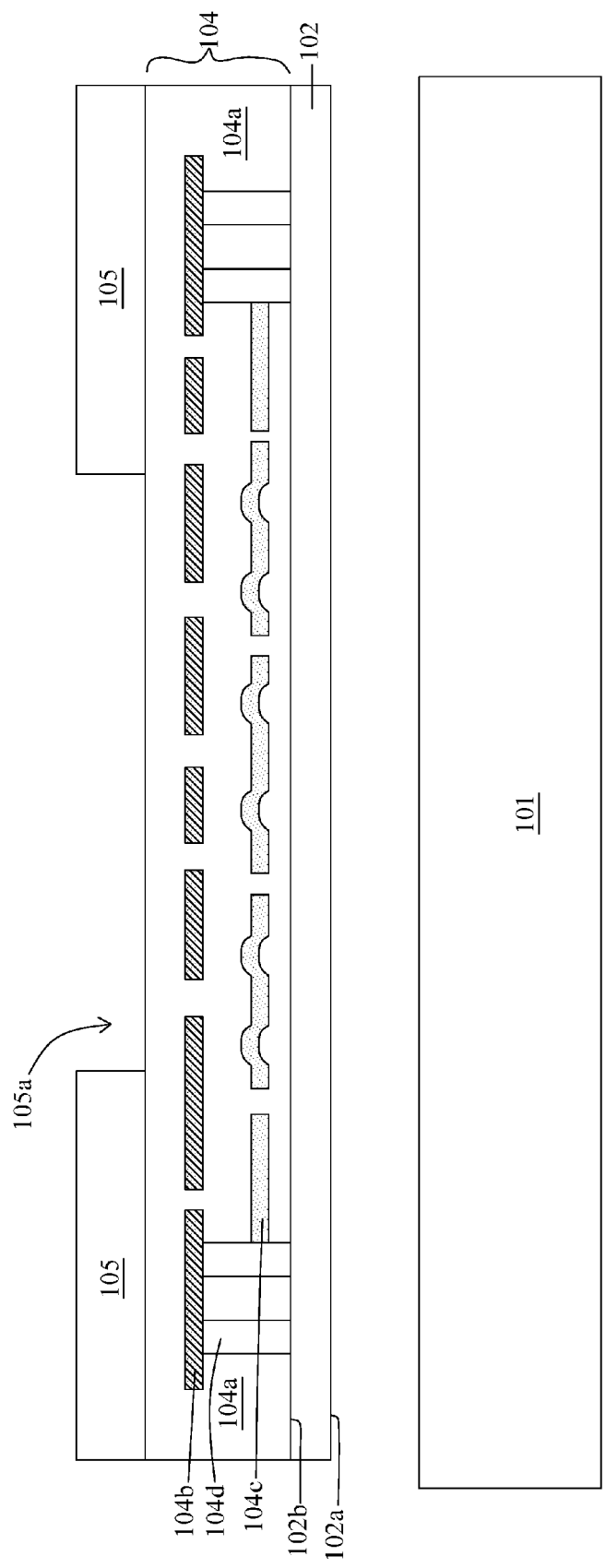

In some embodiments, a third substrate 105 is provided or received, and is disposed over the device 104 as shown in FIG. 4D after the disposing of the device 104 over the second substrate 102. In some embodiments, the disposing of the third substrate 105 is performed after the operation 203. In some embodiments, the third substrate 105 is a capping wafer. In some embodiments, the third substrate 105 includes silicon, glass, etc. In some embodiments, the third substrate 105 is a silicon substrate or a glass substrate. In some embodiments, the third substrate 105 is ground to reduce its thickness after the disposing over the second substrate 102. In some embodiments, the third substrate 105 is thinned down by grinding or any other suitable operations. In some embodiments, a third through hole 105a is formed as shown in FIG. 4E. In some embodiments, a portion of the third substrate 105 is removed to form the third through hole 105a. In some embodiments, the third through hold 105a is formed by photolithography, etching or any other suitable operations. In some embodiments, the third substrate 105 has similar configuration as described above or illustrated in any one of FIGS. 1-3.

Figure 4F:
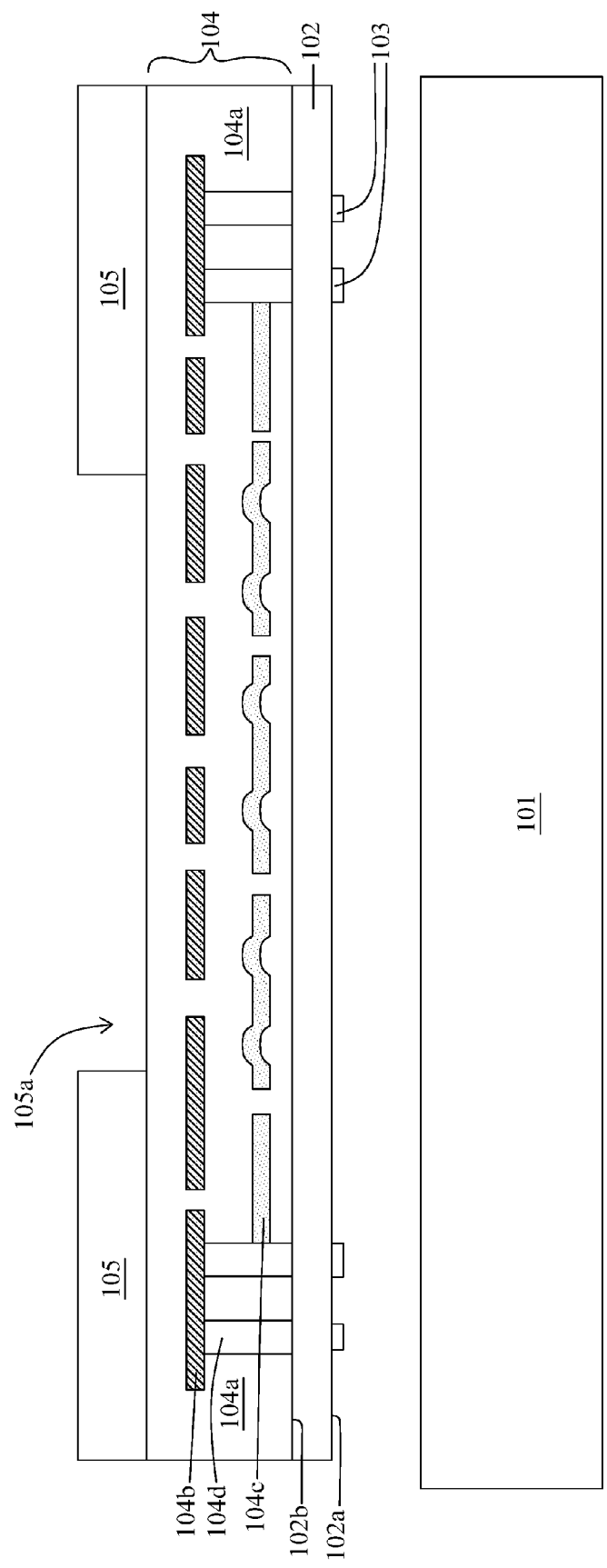

In operation 204, a pad 103 is disposed over the second substrate 102 as shown in FIG. 4F. In some embodiments, the pad 103 is disposed over the first surface 102a of the second substrate 102. In some embodiments, the pad 103 is disposed at a predetermined position aligned with the conductive structure 104d exposed from the dielectric layer 104a. In some embodiments, the pad 103 is formed by electroplating, sputtering or any other suitable operations. In some embodiments, the pad 103 is conductive or semiconductive. In some embodiments, the pad 103 includes copper, silver, gold, germanium or etc. In some embodiments, the pad 103 is a contact or an electrode.

Figure 4G:
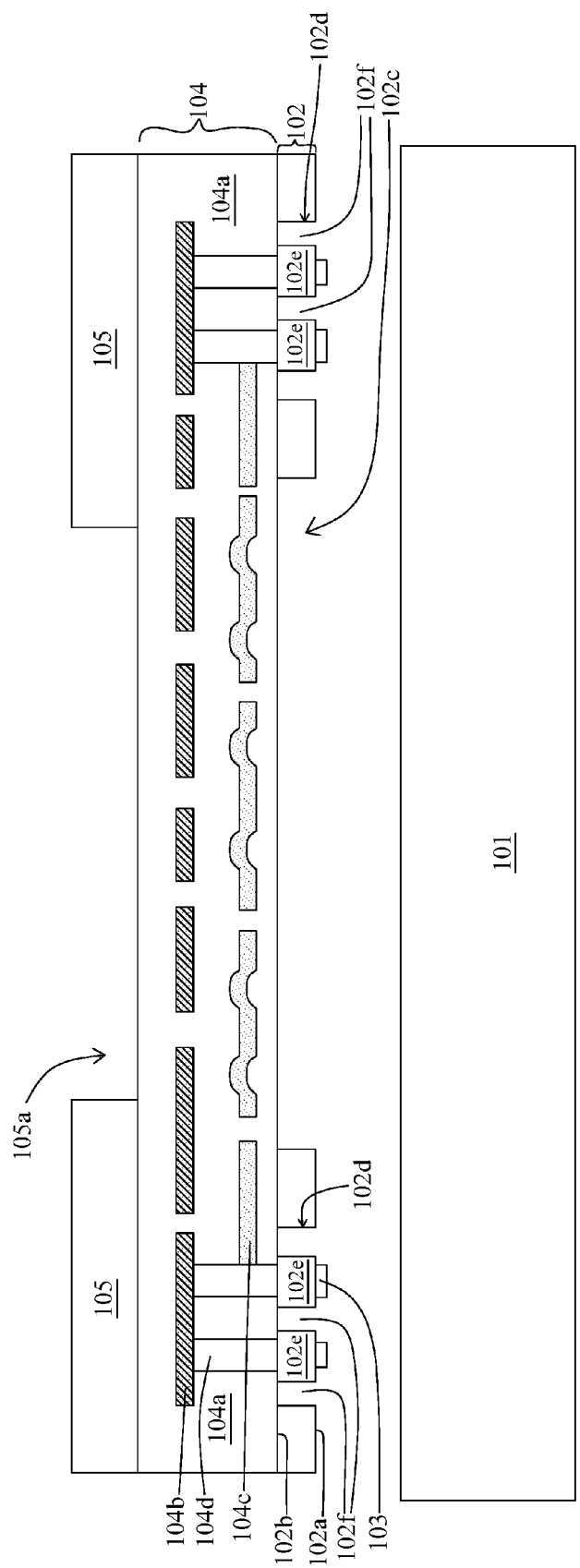

In operation 205, several portions of the second substrate 102 are removed as shown in FIG. 4G. In some embodiments, several portions of the second substrate 102 are removed by photolithography, etching or any other suitable operations. In some embodiments, a first through hole 102c, a second through hole 102d and a via portion 102e are formed after the removal of portions of the second substrate 102. In some embodiments, a first portion of the second substrate 102 is removed to form the first through hole 102c. In some embodiments, a second portion of the second substrate 102 is removed to form the second through hole 102d and the via portion 102e. In some embodiments, the via portion 102e is disposed within the second through hole 102d. In some embodiments, the via portion 102e is surrounded by a gap 102f after the removal of the second portion of the second substrate 102. In some embodiments, the pad 103 is disposed over the via portion 102e of the second substrate 102. In some embodiments, the dielectric layer 104a of the device 104 is bonded with the via portion 102e. In some embodiments, the third through hole 105a is disposed over or aligned with the first through hole 102c. In some embodiments, the first through hole 102c, the second through hole 102d and the via portion 102e have similar configurations as described above or illustrated in any one of FIGS. 1-3.

Figure 4H:
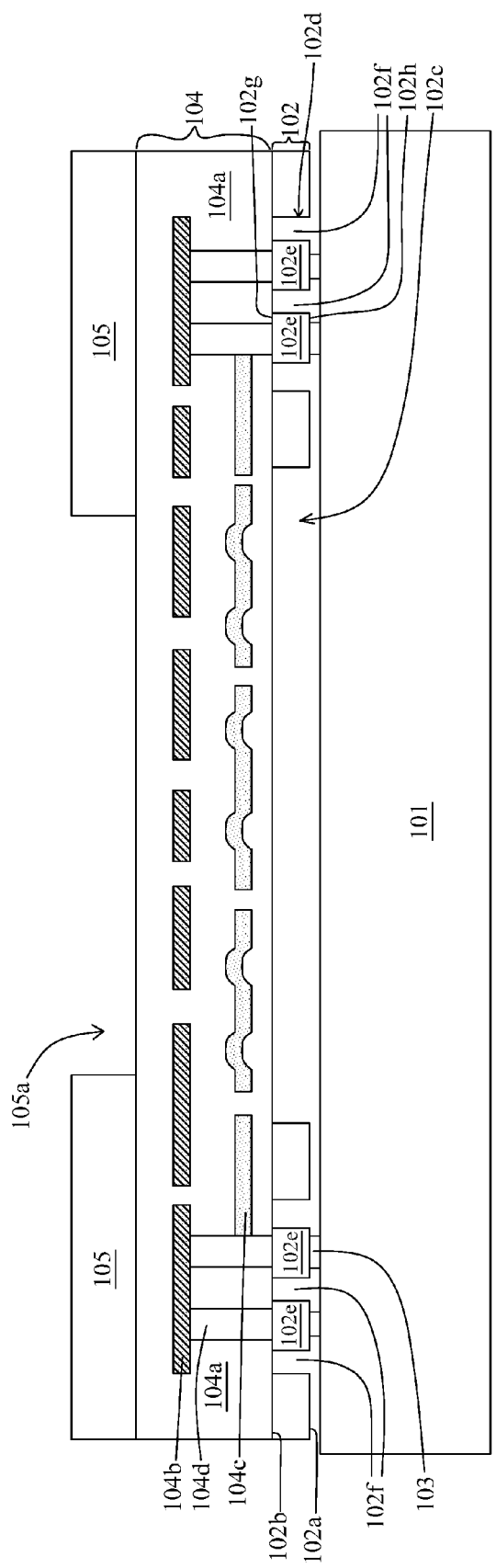

In operation 206, the pad 103 is bonded with the first substrate 101 as shown in FIG. 4H. In some embodiments, the pad 103 is bonded with the first substrate 101 by eutectic bonding or any other suitable operations. In some embodiments, the device 104 is electrically connected to the first substrate 101 through the via portion 102e and the pad 103.

Figure 4I:
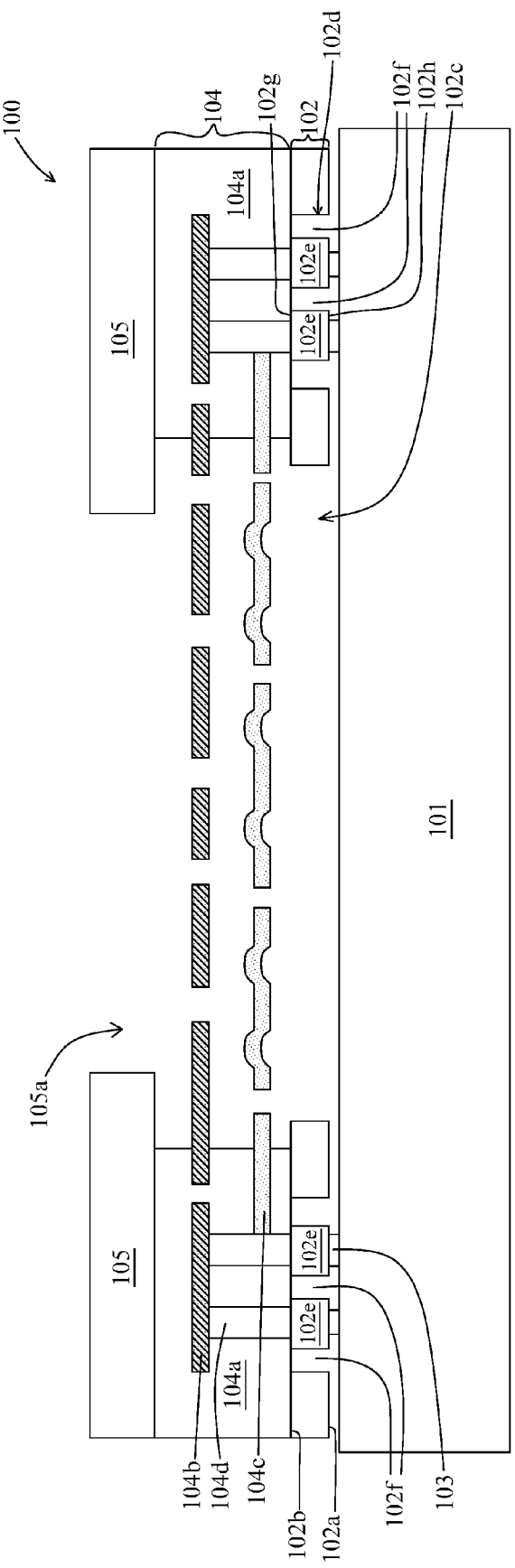

In operation 207, a portion of the dielectric layer 104a is removed to at least partially expose the backplate 104b and the membrane 104c as shown in FIG. 4I. In some embodiments, the portion of the dielectric layer 104a is removed by etching or any other suitable operations. In some embodiments, the bonding of the pad 103 with the first substrate 101 is performed before the removal of the portion of the dielectric layer 104a. In some embodiments, the operation 206 is performed before the operation 207. In some embodiments, the backplate 104b exposed from the dielectric layer 104a and the membrane 104c exposed from the dielectric layer 104a are disposed over or aligned with the first through hole 102c. In some embodiments, the third through hole 105a is disposed over or aligned with the backplate 104b exposed from the dielectric layer 104a and the membrane 104c exposed from the dielectric layer 104a.

In some embodiments, a semiconductor structure 100 is formed, which has similar configuration as described above or illustrated in any one of FIGS. 1-3. In some embodiments, the membrane 104c is displaceable relative to the backplate 104b after the removal of the portion of the dielectric layer 104a. In some embodiments, the membrane 102 is configured to sense an acoustic pressure received from the third through hole 105a. When the membrane 104c is displaced by an acoustic pressure, the displacement of the membrane 104c relative to the backplate 104b is converted into an electrical signal corresponding to a magnitude and frequency of the displacement.

Figure 4J:
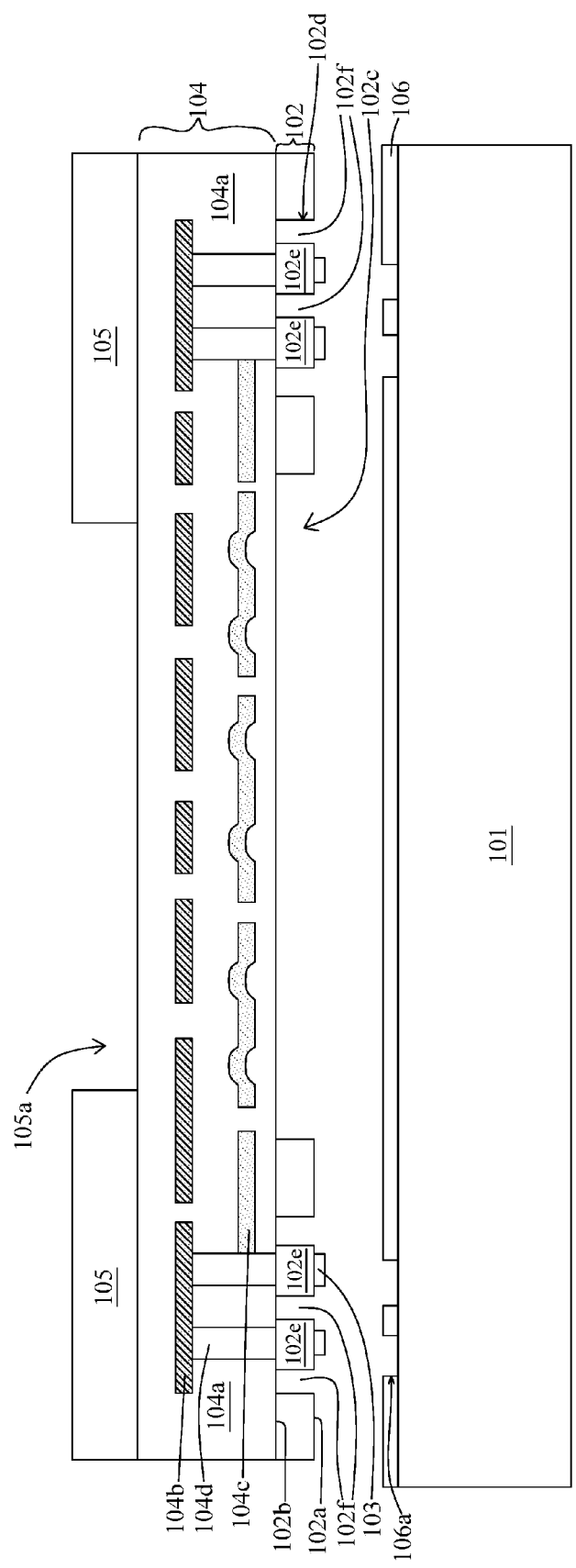

In some embodiments, a protective layer 106 is disposed over the first substrate 101 as shown in FIG. 4J before the removal of the portion of the dielectric layer 104a. In some embodiments, the protective layer 106 is disposed over the first substrate 101 by deposition, CVD or any other suitable operations. In some embodiments, the protective layer 106 is an etching stop layer to prevent the first substrate 101 and the components disposed over the first substrate 101 from being attacked during the removal of the portion of the dielectric layer 104a. In some embodiments, the protective layer 106 protects the first substrate 101 from being attacked by hydrofluoric (HF) acid vapor. In some embodiments, the protective layer 106 includes aluminum oxide ($Al_2O_3$). In some embodiments, the protective layer 106 is patterned by removing a portion of the protective layer 106 to form an opening 106a. In some embodiments, the protective layer 106 is patterned by photolithography, etching or any other suitable operations. In some embodiments, a portion of the first substrate 101 is exposed from the opening 106a, such that the first substrate 101 exposed from the opening 106a is configured to electrically connect to an external circuitry or external conductive structure.

Figure 4K:
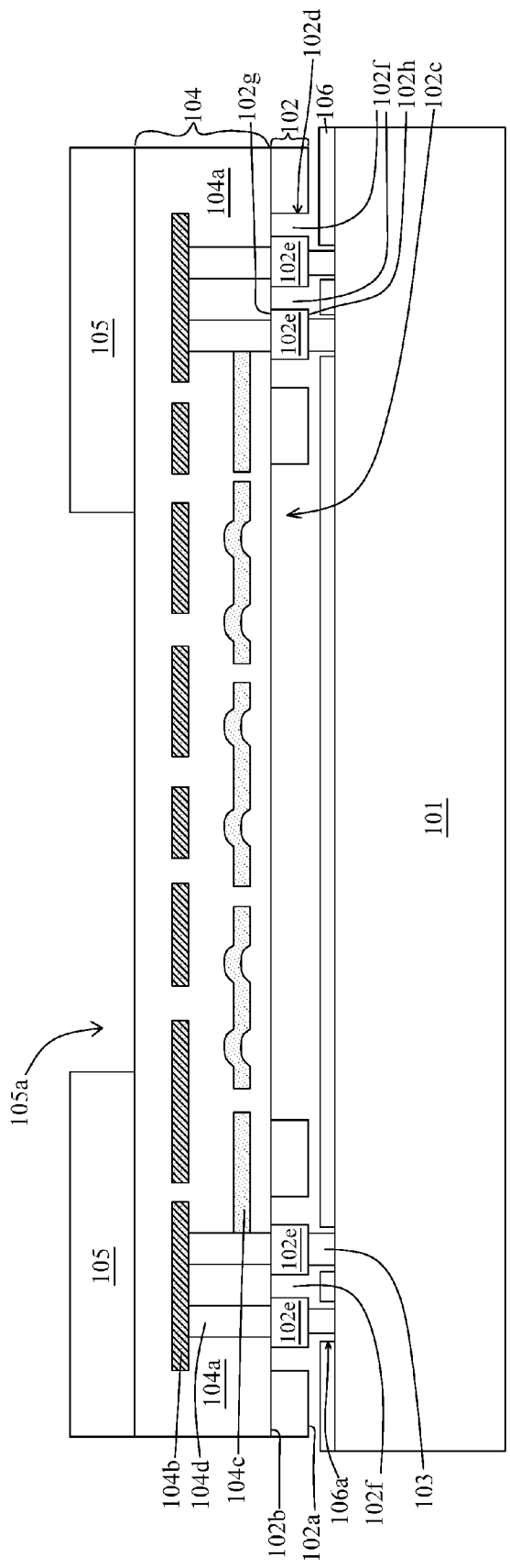
Figure 4L:
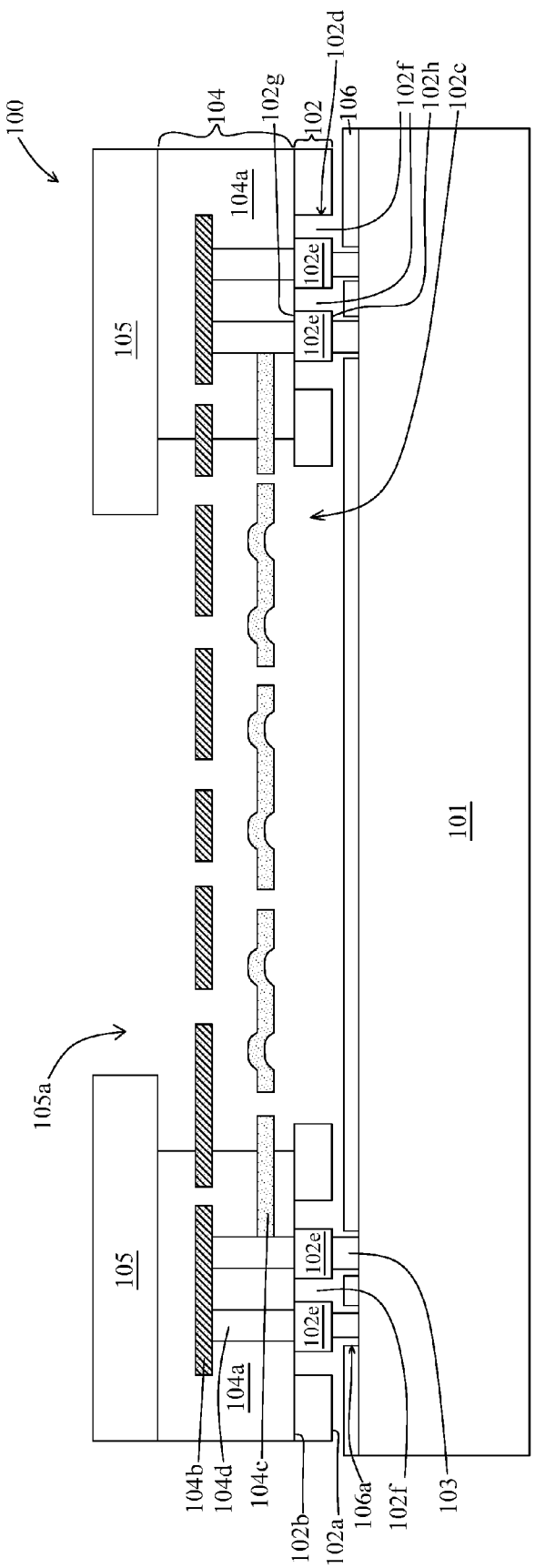

In some embodiments, the pad 103 is bonded with the first substrate 101 including the protective layer 106 as shown in FIG. 4K. In some embodiments, the bonding of the pad 103 with the first substrate 101 is similar to the operation 206 described above. In some embodiments, the pad 103 is disposed within the opening 106a. In some embodiments, the portion of the dielectric layer 104a is removed after the bonding of the pad 103 as shown in FIG. 4L. In some embodiments, the removal of the portion of the dielectric layer 104a is similar to the operation 207 described above.

Figure 4M:
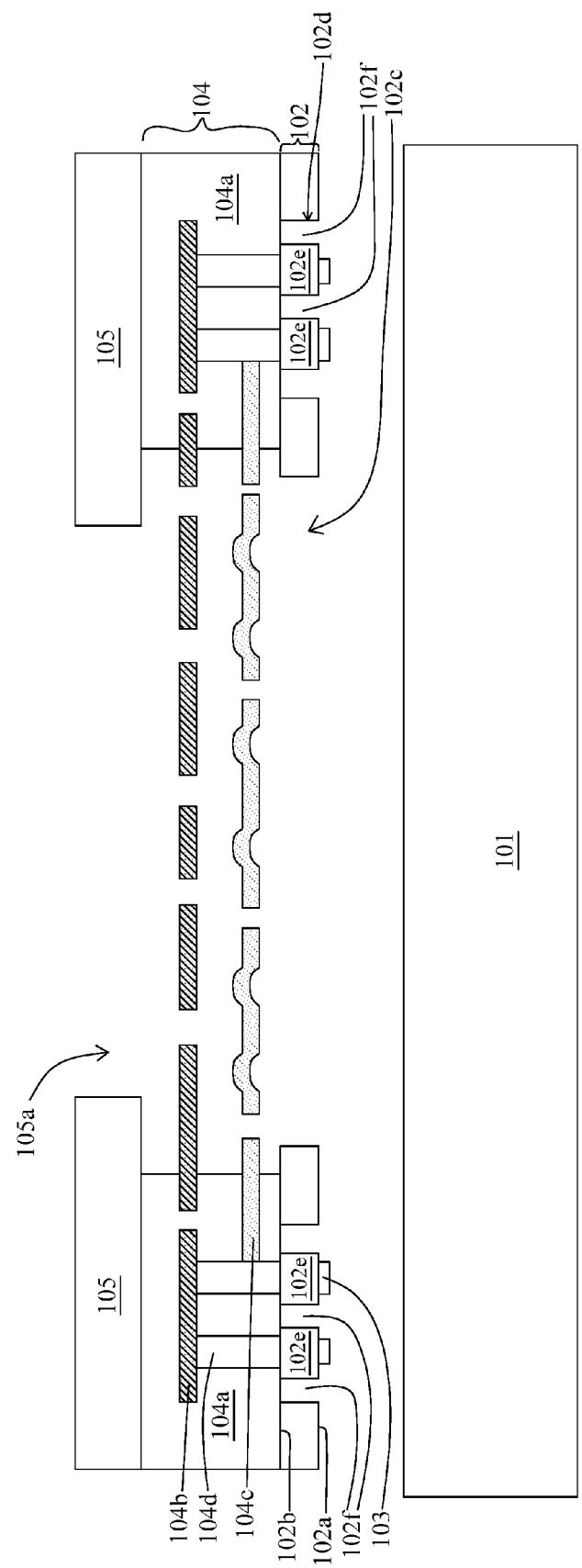
Figure 4N:
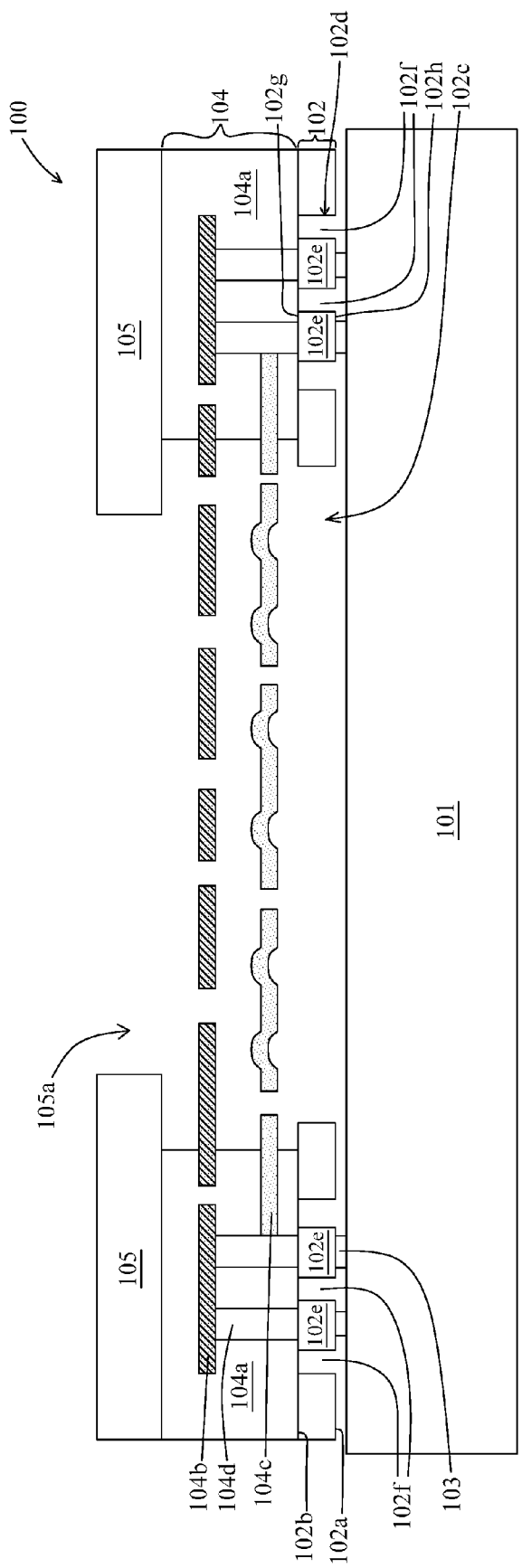

In some embodiments, the bonding of the pad 103 with the first substrate 101 is performed after the removal of the portion of the dielectric layer 104a. In some embodiments, the operation 206 is performed after the operation 207. In some embodiments, the portion of the dielectric layer 104a is removed as shown in FIG. 4M, and then the pad 103 is bonded with the first substrate 101 as shown in FIG. 4N. In some embodiments, the removal of the portion of the dielectric layer 104a is similar to the operation 207 described above. In some embodiments, the bonding of the pad 103 is similar to the operation 206 described above.

In the present disclosure, an improved semiconductor structure is disclosed. The semiconductor structure includes a substrate which is conductive, has ultra-low resistance or has a resistivity less than 0.01 ohm-cm. Further, the second substrate includes a via portion which is also conductive. As such, a device can electrically connect to another substrate through the via portion. Such configuration can reduce or prevent parasitic capacitance and minimize a size of the semiconductor structure.

In some embodiments, a semiconductor structure includes a first substrate, a second substrate disposed over the first substrate, and including a first surface, a second surface opposite to the first surface, a via portion extending between the first surface and the second surface, a first through hole and a second through hole, and a device disposed over the second surface, and including a dielectric layer, a backplate at least partially exposed from the dielectric layer and a membrane at least partially exposed from the dielectric layer and disposed between the backplate and the first substrate, wherein the via portion is disposed within the second through hole, and the dielectric layer is bonded with the second substrate, and the device is electrically connected to the first substrate through the via portion.

In some embodiments, the second substrate or the via portion includes silicon, is conductive, has ultra-low resistance or has a resistivity substantially less than 0.01 ohm-cm. In some embodiments, a thickness of the second substrate or a height of the via portion is about 300 um to about 750 um. In some embodiments, the backplate and the membrane are electrically connected to the via portion. In some embodiments, the first through hole is surrounded by the second through hole and the via portion. In some embodiments, the second substrate is spaced from the first substrate in a distance. In some embodiments, a portion of the backplate exposed from the dielectric layer and a portion of the membrane exposed from the dielectric layer are disposed over or aligned with the first through hole. In some embodiments, a portion of the backplate within the dielectric layer or a portion of the membrane within the dielectric layer is electrically connected to a conductive structure, and the conductive structure is contacted with the via portion. In some embodiments, a width of the first through hole is substantially greater than a width of the second through hole, or a width of the via portion is substantially smaller than the width of the second through hole. In some embodiments, a gap is disposed between the via portion and the second through hole, or the via portion is surrounded by the gap. In some embodiments, the semiconductor structure further includes a third substrate disposed over the device, and including a third through hole disposed over or aligned with the first through hole.

In some embodiments, a semiconductor structure includes a CMOS substrate, a MEMS device disposed over the CMOS substrate, and including a dielectric layer, a backplate at least partially exposed from the dielectric layer and a membrane at least partially exposed from the dielectric layer, and a silicon via including a first end bonded with the dielectric layer and electrically connected with the backplate and the membrane, and a second end electrically connected to the CMOS substrate, wherein the MEMS device is electrically connected to the CMOS substrate through the silicon via.

In some embodiments, the silicon via is conductive, has ultra-low resistance or has a resistivity substantially less than 0.01 ohm-cm. In some embodiments, the semiconductor structure further includes a pad disposed between the second end and the CMOS substrate and bonded the silicon via with the CMOS substrate. In some embodiments, the semiconductor structure further includes a patterned protective layer disposed over the CMOS, wherein the patterned protective layer includes an opening for electrically connecting the silicon via portion with the CMOS substrate.

In some embodiments, a method of manufacturing a semiconductor structure includes providing a first substrate, providing a second substrate including a first surface and a second surface opposite to the first surface, disposing a device over the second surface of the second substrate, wherein the device includes a dielectric layer, a backplate disposed within the dielectric layer and a membrane disposed within the dielectric layer, disposing a pad over the first surface of the second substrate, removing a first portion of the second substrate to form a first through hole, removing a second portion of the second substrate to form a second through hole, bonding the pad with the first substrate, removing a portion of the dielectric layer of the device to at least partially expose the backplate and the membrane, wherein the removing the second portion of the second substrate includes forming a via portion disposed within the second through hole.

In some embodiments, the bonding the pad with the first substrate is performed before or after the removing the portion of the dielectric layer of the device. In some embodiments, the dielectric layer of the device is bonded with the via portion or the second substrate. In some embodiments, the pad is disposed over the via portion of the second substrate. In some embodiments, the method further includes disposing a third substrate over the device, removing a portion of the third substrate to form a third through hole disposed over or aligned with the first through hole, the backplate exposed from the dielectric layer or the membrane exposed from the dielectric layer, or disposing and patterning a protective layer over the first substrate before the removing the portion of the dielectric layer, or thinning down a thickness of the second substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor structure, comprising:
   a first substrate;
   a second substrate disposed over the first substrate, and including a first surface, a second surface opposite to the first surface, a via portion extending between the first surface and the second surface, a first through hole and a second through hole;
   a device disposed over the second surface, and including a dielectric layer, a backplate at least partially exposed from the dielectric layer and a membrane at least partially exposed from the dielectric layer and disposed between the backplate and the first substrate; and
   a third substrate disposed over the device, and including a third through hole disposed over or aligned with the first through hole,
   wherein the via portion is disposed within the second through hole, and the dielectric layer is bonded with the second substrate, and the device is electrically connected to the first substrate through the via portion,
   wherein the second substrate is semiconductive or conductive.

2. The semiconductor structure of claim 1, wherein the second substrate or the via portion includes silicon, has ultra-low resistance or has a resistivity substantially less than 0.01 ohm-cm.

3. The semiconductor structure of claim 1, wherein a thickness of the second substrate or a height of the via portion is about 300 um to about 750 um.

4. The semiconductor structure of claim 1, wherein the backplate and the membrane are electrically connected to the via portion.

5. The semiconductor structure of claim 1, wherein the first through hole is surrounded by the second through hole and the via portion.

6. The semiconductor structure of claim 1, wherein the second substrate is spaced from the first substrate in a distance.

7. The semiconductor structure of claim 1, wherein a portion of the backplate exposed from the dielectric layer and a portion of the membrane exposed from the dielectric layer are disposed over or aligned with the first through hole.

8. The semiconductor structure of claim 1, wherein a portion of the backplate within the dielectric layer or a portion of the membrane within the dielectric layer is electrically connected to a conductive structure, and the conductive structure is contacted with the via portion.

9. The semiconductor structure of claim 1, wherein a width of the first through hole is substantially greater than a width of the second through hole, or a width of the via portion is substantially smaller than the width of the second through hole.

10. The semiconductor structure of claim 1, wherein a gap is disposed between the via portion and the second through hole, or the via portion is surrounded by the gap.

11. A semiconductor structure, comprising:
    a CMOS substrate;
    a MEMS device disposed over the CMOS substrate, and including a dielectric layer, a backplate at least partially exposed from the dielectric layer and a membrane at least partially exposed from the dielectric layer; and
    a silicon via including a first end bonded with the dielectric layer and electrically connected with the backplate and the membrane, and a second end electrically connected to the CMOS substrate,
    wherein the MEMS device is electrically connected to the CMOS substrate through the silicon via.

12. The semiconductor structure of claim 11, wherein the silicon via is conductive, has ultra-low resistance or has a resistivity substantially less than 0.01 ohm-cm.

13. The semiconductor structure of claim 11, further comprising a pad disposed between the second end and the CMOS substrate and bonded the silicon via with the CMOS substrate.

14. The semiconductor structure of claim 11, further comprising a patterned protective layer disposed over the CMOS, wherein the patterned protective layer includes an opening for electrically connecting the silicon via portion with the CMOS substrate.

15. A semiconductor structure, comprising:
    a CMOS substrate;
    a MEMS device disposed over the CMOS substrate, and including a dielectric layer, a backplate at least partially disposed within the dielectric layer and a membrane at least partially disposed within the dielectric layer and disposed between the backplate and the CMOS substrate;
    a plurality of silicon vias disposed between the dielectric layer and the CMOS substrate; and
    a through hole extended through the dielectric layer, exposing at least a portion of the backplate and at least a portion of the membrane, and surrounded by the plurality of silicon vias, wherein the backplate and the membrane are electrically connected to the CMOS substrate through the plurality of silicon vias.

16. The semiconductor structure of claim 15, wherein the backplate includes a plurality of apertures extended through the backplate, the membrane includes a plurality of corrugations, the plurality of apertures and the plurality of corrugations are disposed within the through hole.

17. The semiconductor structure of claim 15, wherein the plurality of silicon vias are bonded with the CMOS substrate by a plurality of pads.

18. The semiconductor structure of claim 15, wherein a height of each of the plurality of silicon vias is about 325 um to about 725 um.

19. The semiconductor structure of claim 15, wherein the plurality of silicon vias are electrically isolated from each other.

* * * * *